United States Patent [19]

Small et al.

[11] Patent Number: 5,203,452
[45] Date of Patent: Apr. 20, 1993

[54] SHIPPING TRAY

[75] Inventors: Edith M, Small, New Lenox; Kenneth R. Steinhart, Frankfort, both of Ill.

[73] Assignee: Illinois Tool Works, Inc., Glenview, Ill.

[21] Appl. No.: 929,730

[22] Filed: Aug. 13, 1992

Related U.S. Application Data

[63] Continuation-in-part of Ser. No. 850,880, Mar. 13, 1992.

[51] Int. Cl.⁵ .............................................. B65D 73/02
[52] U.S. Cl. .................... 206/329; 206/331; 206/332; 206/503
[58] Field of Search ............... 206/328, 329, 331, 332, 206/503, 508, 509, 561, 564

[56] References Cited

U.S. PATENT DOCUMENTS

| | | | |
|---|---|---|---|
| 3,701,079 | 10/1972 | Bowden et al. | 206/329 X |
| 4,448,306 | 5/1984 | Sinnadurai et al. | 206/332 X |
| 4,595,096 | 6/1986 | Sinnadurai et al. | 206/331 |
| 4,620,632 | 11/1986 | Alemanni | 206/329 |
| 4,671,407 | 6/1987 | Brutosky | 206/332 |
| 4,762,606 | 8/1988 | Root | 206/328 |
| 5,109,981 | 5/1992 | Maston, III et al. | 206/331 |
| 5,131,535 | 7/1982 | O'Connor et al. | 206/332 X |

Primary Examiner—Steven N. Meyers
Assistant Examiner—Jacob K. Ackun, Jr.
Attorney, Agent, or Firm—Kane, Dalsimer, Sullivan, Kurucz, Levy, Eisele and Richard

[57] ABSTRACT

A one-piece injection-molded shipping tray has a number of internal pockets for seating electronic components to be shipped. The tray is an open latticework within a peripheral frame, and may be stacked with others of its kind as the peripheral frame has a rim within which another tray may be seated. The tray includes a locking mechanism, enabling it to be locked to another in a stacked relationship. As such, the tray may also serve as a covering lid for another tray. The internal pockets are joined to one another, and to the frame, by joining members which have narrowed portions. These may be readily severed with an appropriate cutting tool to detach an internal pocket from the tray. In this event, a single internal pocket, holding an electronic component, may be attached to another single internal pocket, sandwiching the electronic component therebetween, by using clamps which engage the bottom of one internal pocket and the notch on top of the other internal pocket.

8 Claims, 4 Drawing Sheets

SHIPPING TRAY

CROSS-REFERENCE TO RELATED APPLICATION

The present application is a continuation in part (CIP) of U.S. patent application Ser. No 07/850,880, filed on Mar. 13, 1992.

BACKGROUND OF THE INVENTION

1. Field of the Invention

The present invention relates generally to the packaging means used to ship delicate electronic components from manufacturer to consumer. More specifically, the present invention constitutes a packaging means particularly well suited for shipping a small number of such components.

2. Description of the Prior Art

Delicate electronic components, such as those which include the integrated circuit devices commonly known as chips, are generally shipped in injection-molded plastic trays. The trays themselves include a frame and a number of internal pockets, each of which may contain an electronic component to be shipped. The internal pockets, however, cannot be readily separated from the frame or from one another in a manner that would permit less than a full tray of electronic components to be shipped without compromising the dimensions and physical integrity of the pockets themselves. In addition, since the connecting leads of such components are extremely delicate, heretofore, it has been difficult to handle and separate internal pockets, loaded with components for shipment, from the frame or from one another for fear of damaging the connecting leads.

The present invention provides a solution to the shortcomings in the prior-art trays of this type in the form of a tray from which an individual internal pocket or strip of internal pockets housing an electronic component or components may be clipped out with an appropriate tool and inserted into a shipping tube for dispatch to a customer. The internal pockets are defined within a frame having raised rims to permit the trays to be stacked one atop the other.

SUMMARY OF THE INVENTION

The present invention is a one-piece injection-molded shipping tray having a plurality of internal pockets for seating electronic components to be shipped. The tray itself is an open latticework within a frame, which defines the tray's outer periphery. The frame has a raised rim on one of either the upper or lower surface, and a flange on the other of the upper or lower surface, so that the trays may be stacked one atop another.

The plurality of internal pockets are arranged within the frame in rows and columns in a grid-like pattern. Each internal pocket is an open-sided figure, such as a square or rectangle, each side of which has a raised lip defining a rim, so that an electronic component may be seated therewithin with its connecting leads completely protected from possible damaging contact with foreign objects.

The internal pockets are joined to one another and to the frame by a plurality of joining members. Each joining member has a narrowed portion, which may be readily cut or severed to remove a single internal pocket, or several joined internal pockets, from the tray, to ship less than a full tray-load of electronic components. Prior to any such removal, however, the tray, comprising frame, internal pockets, and joining members, is an integral structure.

The tray further includes interlocking means so that, when a plurality of trays are stacked one atop the next, each may be locked to those above and below. In this regard, a shipping tray may be used as a covering lid for another tray previously loaded with electronic components. The interlocking means on a shipping tray may be designed to cooperate with similar means on only one of the two ends of another shipping tray, so that the trays may be stacked in an interlockable or non-interlockable condition to suit the requirements of the user.

The internal pockets themselves are also provided with peripheral notches adjacent to the rims so that, when removed from the shipping tray to ship a single or small number of electronic components, the internal pockets above and below the electronic component from the upper and lower of two shipping trays, the upper shipping tray being used as a covering lid, may be held together with a C-clamp which hooks below the lower internal pocket and fits into the notch on the upper internal pocket.

The present invention will now be described in more complete detail with reference being made, where appropriate, to the several figures which are identified below.

DETAILED DESCRIPTION OF THE PREFERRED EMBODIMENT

Figure 1:
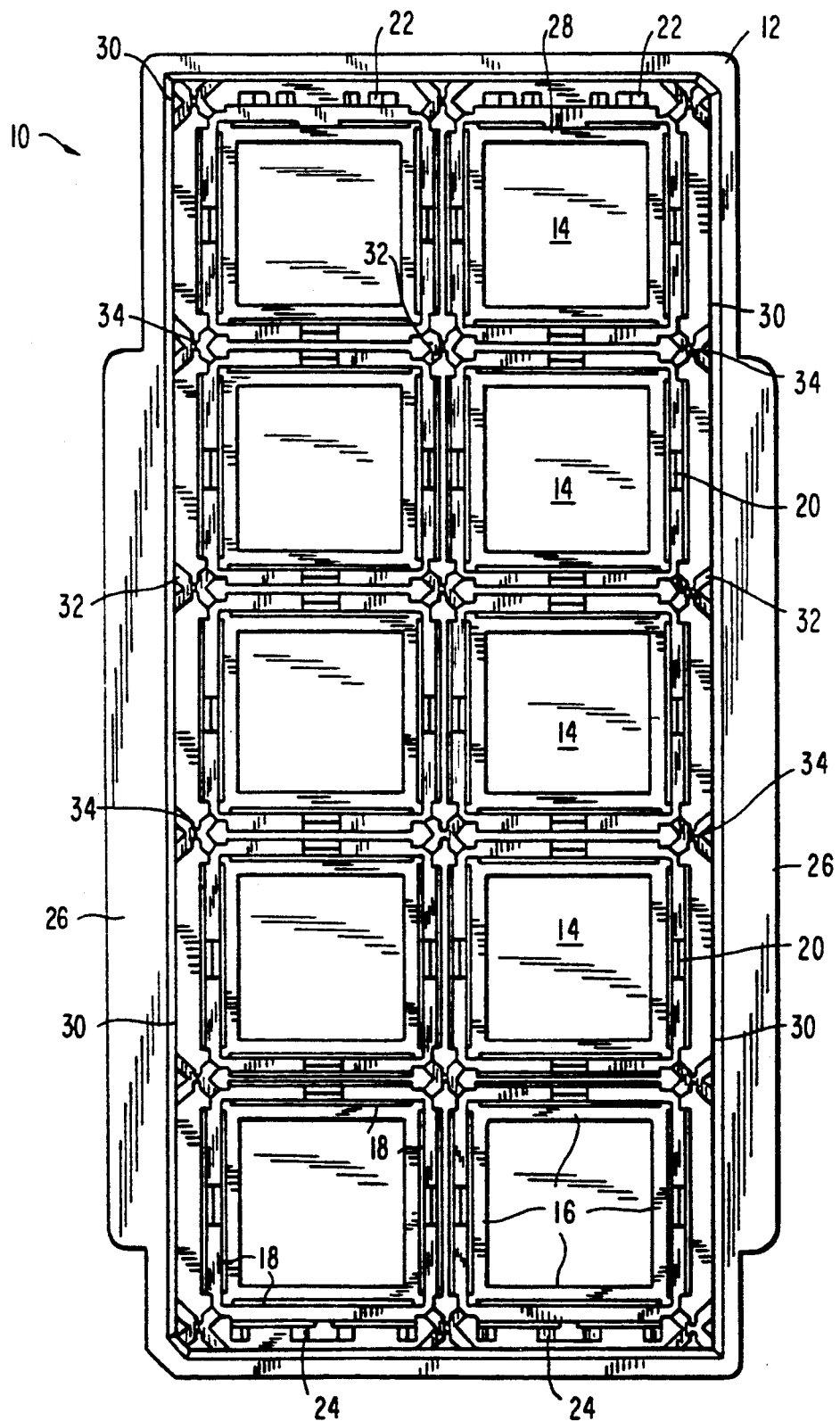
FIG. 1 is a plan view of the shipping tray of the present invention.

Turning first to FIG. 1, the shipping tray 10 of the present invention includes a frame 12 which forms its outer periphery. Within frame 12 is a plurality of internal pockets 14 arranged in rows and columns in a grid-like pattern. Each internal pocket 14 is defined by a plurality of sides 16; said plurality may be four, in which case the internal pockets 14 may be of rectangular or square shape. Each side 16 has a raised lip defining rim 18 so that an electronic component of appropriate size may be seated within the internal pocket 14 secured in position by rim 18. By properly dimensioning the lip with respect to the length of the connecting leads of the component to be packaged therein, the trays may be stacked on top of each other without danger of damaging the connecting leads.

Each internal pocket 14 is further provided with at least one peripheral notch 20 adjacent to and outside the rim 18. In a manner to be discussed below, peripheral notches 20 permit clamps, such as C-clamps, to hold two overlying internal pockets 14, and an electronic component disposed therebetween, together when less than an entire tray-load of components is to be shipped.

Tray 10 is also provided with first interlocking means 22 on one end thereof, and with second interlocking means 24 at the other end thereof. First interlocking means 22 may interlock with second interlocking means 24 of another tray 10 when the two trays 10 are appropriately placed one atop the other. However, first interlocking means 22 will not interlock with first interlocking means 22 of another tray 10, nor will second interlocking means 24 interlock with second interlocking means 24 of another tray 10. As a consequence, the user may stack trays 10 interlocked or not interlocked as he or she wishes. To enable the user to choose whether to interlock the overlying or stacked trays, the frame 12 of the tray 10 has a widened portion 26 which is offset toward one of the two ends of the tray 10. Accordingly, when the trays 10 are stacked with the widened portions 26 of each in alignment, the trays will not be interlocked together. On the other hand, when the trays 10 are stacked with the widened portions 26 at alternating ends thereof, the trays 10 will be interlocked together. In this manner, a tray 10 may be used as a covering lid for another tray 10. It will be observed in FIG. 1 that first interlocking means 22 and second interlocking means 24 are at opposite ends of each strip 28 of internal pockets 14.

Frame 12 also has a rim 30. The underside of frame 12, not shown, has a flange which sits within rim 30 to facilitate the stacking of trays 10.

The internal pockets 14 are connected to one another and to the frame 12 by at least one joining member 32. The joining members 32 may, for example, be X-shaped as shown in FIG. 1. Each joining member 32 has a narrowed portion 34. By severing the narrowed portion 34 of the appropriately chosen joining members 32, a single internal pocket 14, several joined internal pockets 14, or a strip 28 of internal pockets 14 may be removed from the frame 12.

Figure 2:
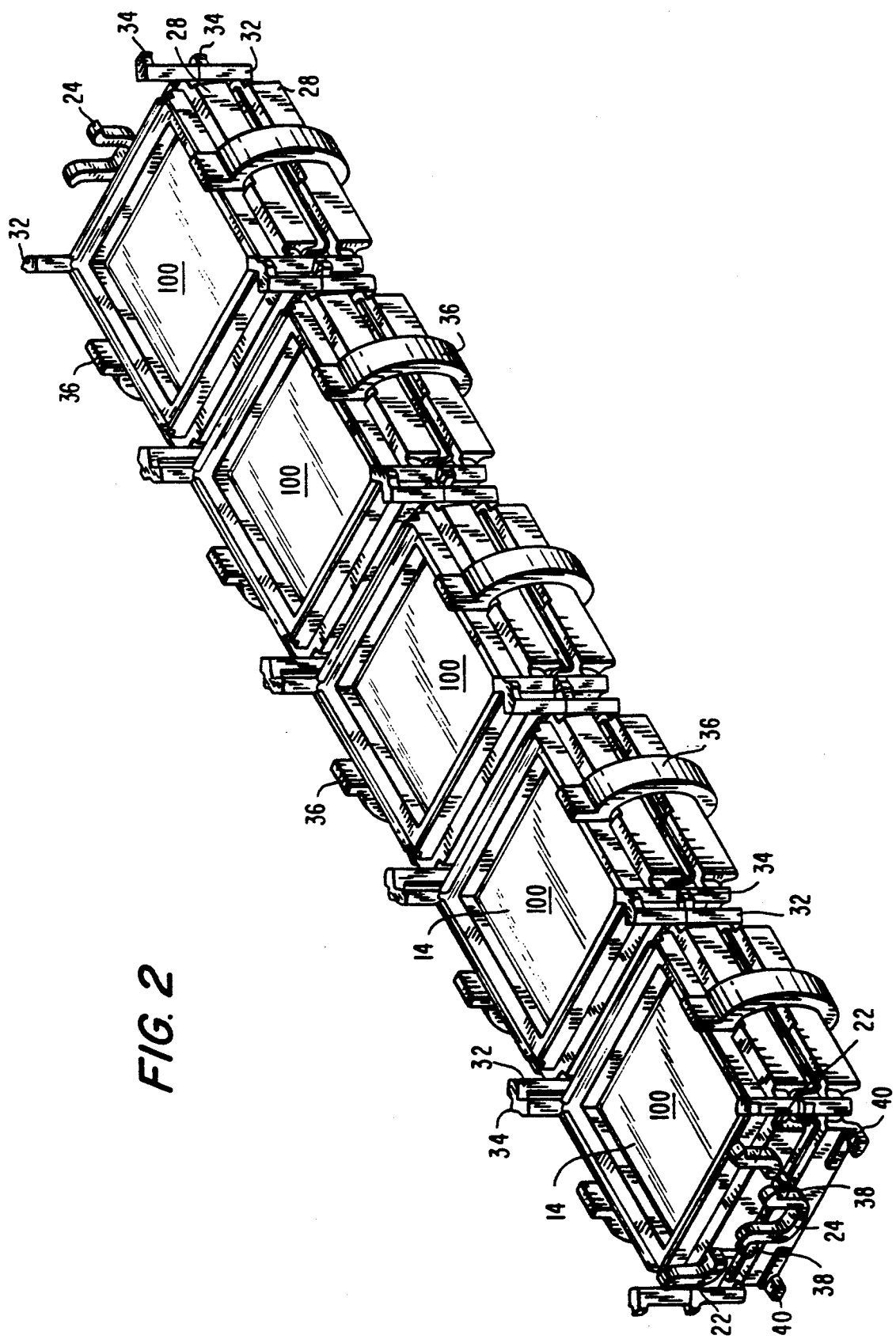
FIG. 2 is a perspective view of two overlying strips of internal pockets cut from the shipping tray.

The last of these possibilities is shown in FIG. 2, or, more specifically, two overlying strips 28 of internal pockets 14 cut from shipping tray 10 are shown. The two strips 28 are interlocked with one another by first interlocking means 22 and second interlocking means 24. They are also held together by C-clamps 36, which clamp the bottom of a lower internal pocket 14 and the peripheral notch 20 on the top of an upper internal pocket 14. Electronic components 100 may thereby be held in each internal pocket 14 between the two strips 28.

Strips 28 have been removed from within frame 12 by severing the narrowed portions 34 of the joining members 32 with a suitable cutting tool.

Figure 3:
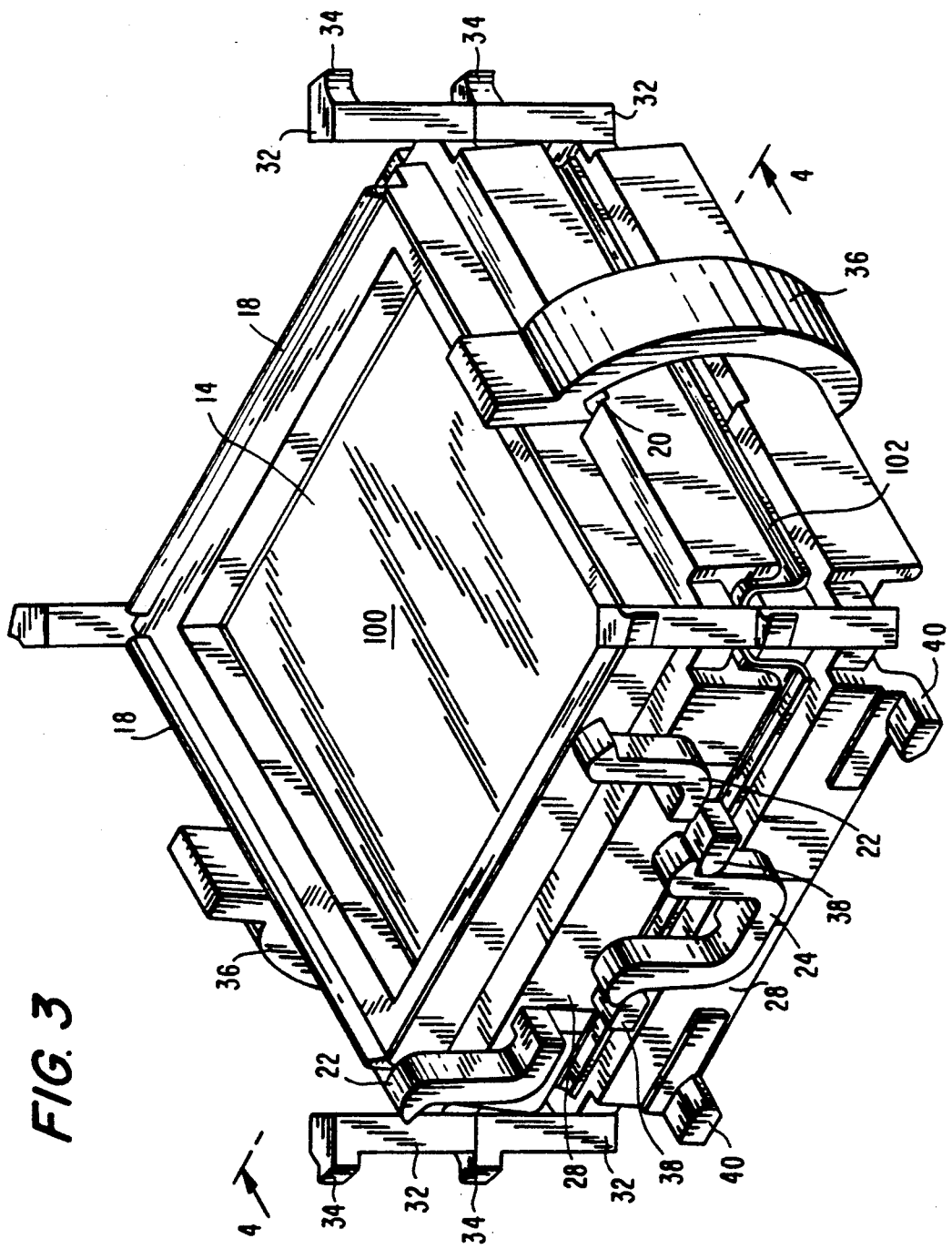
FIG. 3 is an enlarged view of the left-hand end of the overlying strips shown in FIG. 2.

An enlarged view of the left-hand end of the overlying strips 28 shown in FIG. 2 is presented in FIG. 3. It will be recognized that first interlocking means 22 of the top strip 28 are engaged with second interlocking means 24 of the bottom strip 28, which interengagement holds the two strips 28 together. More specifically, second interlocking means 24 on the bottom strip 28 is a substantially U-shaped locking member, having a hooked prong, which resiliently engages with projecting members 38 on the top strip 28. Similarly, if the top strip 28 in FIG. 3 were placed on the bottom, first interlocking means 22, a substantially split U-shaped locking member, having a hooked prong, would resiliently engage with projecting members 40 on the bottom strip 28. It will finally be observed that when two strips 28 are placed atop one another with the two like ends adjacent to one another, no interlocking can take place. This is because the hooked prongs of both the first interlocking means 22 and second interlocking means 24 are not in positions to engage with projecting members 38,40 on their own respective ends of strip 28.

An electronic component 100 is shown between the two strips 28 in FIG. 3. Connecting leads 102 are protected from possible damage by being held therebetween. C-clamps 36, extending from the lower strip 28 to the peripheral notch 20 adjacent to the rim 18, clamps the top and bottom strips together.

Figure 4:
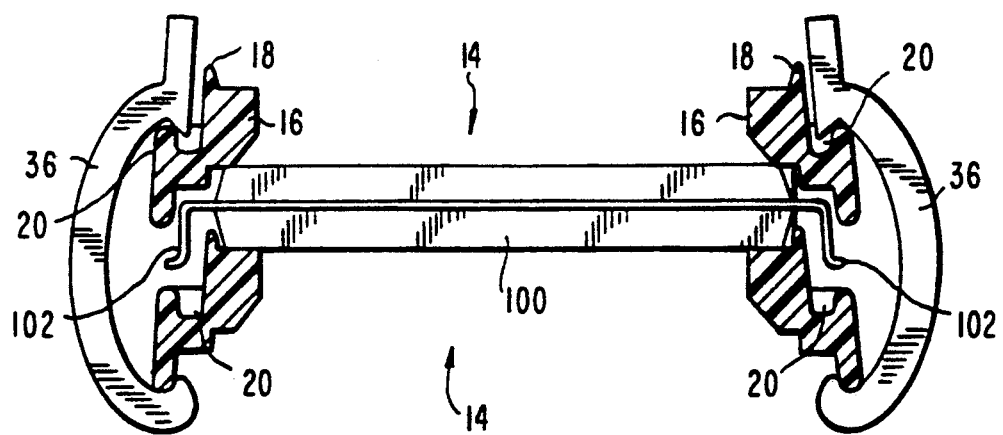
FIG. 4 is a cross-section taken as indicated by line 4—4 in FIG. 3.

FIG. 4 is a cross-section taken as indicated by line 4—4 in FIG. 3, and shows how the C-clamp 36 holds an upper internal pocket 14 to a lower internal pocket 14 by extending from below the lower internal pocket 14 to the peripheral notch 20 on the upper internal pocket 14, in so doing clamping an electronic component 100 therebetween and leaving its connecting leads 102 in a protected position.

Modifications to the above would be obvious to those skilled in the art, yet would not bring the device so modified beyond the scope of the appended claims.

What is claimed is:

1. A shipping tray for shipping electronic components, said tray comprising:

an open latticework integral tray defining a plurality of pockets, each of said pockets being bordered by a plurality of sides, each of said sides having a raised lip which cooperates with lips of other sides of said pocket in defining a rim within which a component may be seated;

a member for joining at least one side of one pocket with at least one side of an adjacent pocket, said joining member having a narrowed portion therein to facilitate the severing thereof; and means on a side of one pocket for interlocking said shipping tray with another shipping tray in a stacked relationship, so that said shipping tray may be used as covering lid for another shipping tray.

2. A shipping tray as claimed in claim 1 wherein said pockets are arranged in a grid-like pattern of rows and columns, and wherein said joining members join pockets in adjacent rows and in adjacent columns to one another.

3. A shipping tray as claimed in claim 2 further comprising a frame defining an outer periphery of said shipping tray, said frame having two row members and two column members enclosing therewithin said plurality of pockets, and additional joining members for joining said two row members and said two column members to an adjacent pocket, said additional joining members also having a narrowed portion therein to facilitate the severing thereof.

4. A shipping tray as claimed in claim 3 wherein said frame has a rim extending peripherally thereabout, so that another shipping tray may be seated therein to facilitate the placing of more than one said tray in a stacked relationship.

5. A shipping tray as claimed in claim 1 wherein said interlocking means comprises a hooked prong and a projecting member on a side of one pocket, said hooked prong on a side of one pocket in one shipping tray engaging with said projecting member on a side of one pocket in another shipping tray to interlock said shipping trays together in a stacked relationship.

6. A shipping tray as claimed in claim 1 wherein said interlocking means comprises a hooked prong and a projecting member at a position on a side of a first pocket, and a hooked prong and a projecting member at a different position on a side of a second pocket, said hooked prong on a side of said first pocket in one shipping tray engaging with said projecting member on a side of said first pocket in another shipping tray, and said hooked prong on a side of said second pocket in one shipping tray engaging with said projecting member on a side of said second pocket in another shipping tray, said hooked prong and projecting member on a side of said first pocket in one shipping tray being incapable of interlocking with said hooked prong and projecting member on a side of said second pocket in another shipping tray as being in different positions on sides of their respective pockets, so that said shipping tray may be stacked with another shipping tray in an interlocked or non-interlocked condition.

7. A shipping tray as claimed in claim 1 wherein each of said pockets has at least one peripheral notch adjacent of said rim.

8. A shipping tray as claimed in claim 7 further comprising at least one clamp, such as a C-clamp, so that a pocket in one shipping tray may be connected to a pocket in another shipping tray stacked above or below by hooking an end of said clamp below the lower pocket and engaging another end of said clamp in said notch.

* * * * *